(12) United States Patent
Wang et al.

(10) Patent No.: US 12,310,126 B2
(45) Date of Patent: May 20, 2025

(54) INFRARED PHOTODETECTOR BASED ON VAN DER WAALS HETEROSTRUCTURE AND PREPARATION METHOD THEREOF

(71) Applicant: SHANGHAI INSTITUTE OF TECHNICAL PHYSICS CHINESE ACADEMY OF SCIENCES, Shanghai (CN)

(72) Inventors: Fang Wang, Shanghai (CN); Fuxing Dai, Shanghai (CN); Weida Hu, Shanghai (CN); Xiaoshuang Chen, Shanghai (CN); Wei Lu, Shanghai (CN)

(73) Assignee: SHANGHAI INSTITUTE OF TECHNICAL PHYSICS CHINESE ACADEMY OF SCIENCES, Shanghai (CN)

( * ) Notice: Subject to any disclaimer, the term of this patent is extended or adjusted under 35 U.S.C. 154(b) by 421 days.

(21) Appl. No.: 17/991,169

(22) Filed: Nov. 21, 2022

(65) Prior Publication Data

US 2024/0047598 A1 Feb. 8, 2024

(30) Foreign Application Priority Data

Aug. 2, 2022 (CN) .......................... 202210920365.0

(51) Int. Cl.
*H10F 30/24* (2025.01)
*H10F 71/00* (2025.01)
(Continued)

(52) U.S. Cl.
CPC ............ *H10F 30/24* (2025.01); *H10F 71/00* (2025.01); *H10F 77/12* (2025.01); *H10F 77/206* (2025.01)

(58) Field of Classification Search
None
See application file for complete search history.

(56) References Cited

U.S. PATENT DOCUMENTS

2020/0343392 A1* 10/2020 Chung .................. H10F 39/802

FOREIGN PATENT DOCUMENTS

CN 117133823 * 11/2023 ........... H10F 77/127

OTHER PUBLICATIONS

Yuanfang Yu et al., Photodetecting and light-emitting devices based on two-dimensional materials, 2017, Chinese Physics, B 26 036801 DOI 10.1088/1674-1056/26/3/036801 (Year: 2017).*

* cited by examiner

*Primary Examiner* — Cory W Eskridge
(74) *Attorney, Agent, or Firm* — BACON & THOMAS, PLLC

(57) ABSTRACT

The present disclosure relates to an infrared photodetector based on a van der waals heterostructure and a preparation method thereof. The infrared photodetector comprises a fully depleted van der waals heterostructure. The fully depleted van der waals heterostructure comprises a first n-type two-dimensional semiconductor layer, a p-type two-dimensional semiconductor layer, and a second n-type two-dimensional semiconductor layer which are sequentially provided from bottom to top. A fully depleted built-in electric field is formed by means of a sandwich structure including the first n-type two-dimensional semiconductor layer, the p-type two-dimensional semiconductor layer and the second n-type two-dimensional semiconductor layer, which can improve the light absorption efficiency while reducing the dark current of a device, and the separation rate and collection efficiency of photo-induced carriers are accelerated.

16 Claims, 7 Drawing Sheets

(51) Int. Cl.
*H10F 77/12* (2025.01)
*H10F 77/20* (2025.01)

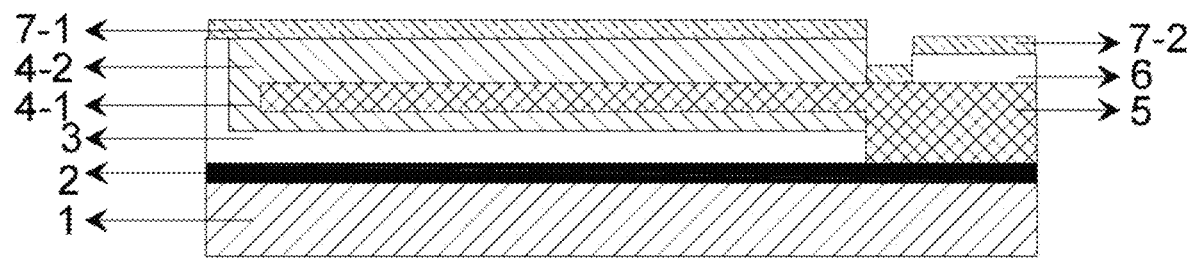
FIG. 1
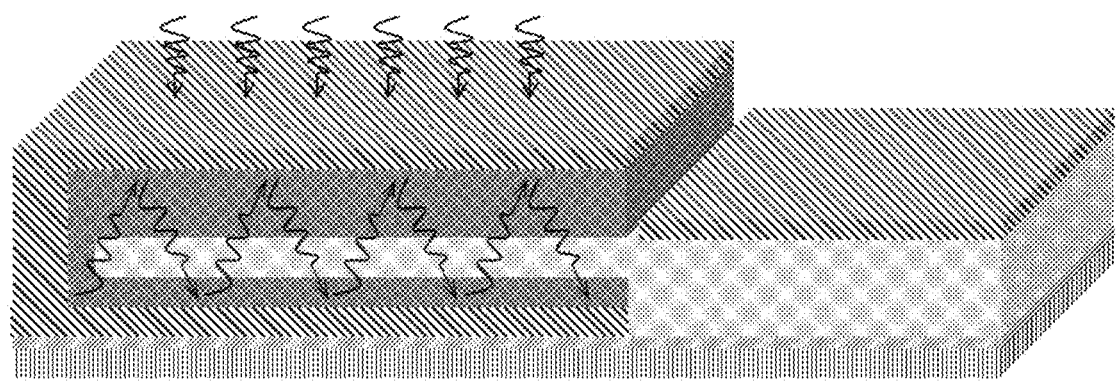
FIG. 2A1
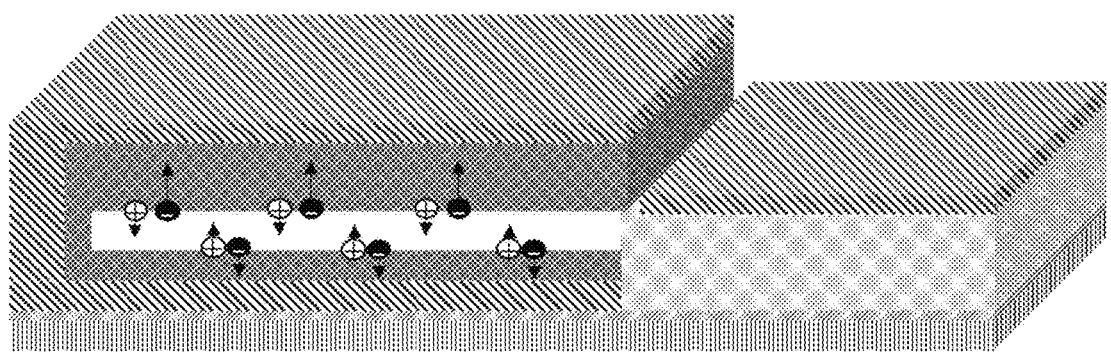
FIG. 2A2

INFRARED PHOTODETECTOR BASED ON VAN DER WAALS HETEROSTRUCTURE AND PREPARATION METHOD THEREOF

CROSS-REFERENCE TO RELATED APPLICATION

This patent application claims the benefit and priority of Chinese Patent Application No. 202210920365.0, filed with the China National Intellectual Property Administration on Aug. 2, 2022, the disclosure of which is incorporated by reference herein in its entirety as part of the present application.

TECHNICAL FIELD

The present disclosure relates to the technical field of photoelectric detection, and in particular relates to an infrared photodetector based on a van der waals heterostructure and a preparation method thereof.

BACKGROUND

Blackbody response is highly desirable for two-dimensional infrared photodetectors, as this determines their practical applications. The detectors based on HgCdTe, PbSe and InSb materials are the most advanced blackbody response mid-wave infrared (MWIR) detectors available at present. However, such photodetectors must operate at low temperatures to reduce thermally generated dark current and noise, which not only increases the size and cost of the whole system, but also limit their wide range of applications. Therefore, there is an urgent need to develop the next generation of MWIR photodetector suitable for scale integration of chips and capable of being operated at room temperature.

With the rise and development of low-dimensional materials, the discovery of two-dimensional narrow bandgap semiconductors has brought new opportunities for the uncooled MWIR detectors, and meanwhile, such detectors have thinner absorbers and lower noises. Materials, such as black phosphorus (BP), Te, $PdSe_2$ and $PtSe_2$, have high carrier mobility and excellent infrared light absorption. More prominently, the two-dimensional layered crystals without dangling bonds may reduce generation-recombination noise, and may also avoid the problems of lattice mismatch and the like. To improve the optical response, researchers have proposed many new ideas and structures, such as black phosphorus BP and optical waveguide integrated infrared photodetectors and Fabry-Perot cavities.

So far, the black body response may be tested in only a few infrared photodetectors based on two-dimensional materials, such as photoconductive low-dimensional infrared photodetectors based on black phosphorus BP, black arsenic phosphorus (BAsP) and low-dimensional Te, and photovoltaic infrared photodetectors based on $BP/MoS_2$ heterostructures. However, the blackbody responsivity of the photovoltaic low-dimensional infrared photodetector is always difficult to exceed that of the photoconductive low-dimensional infrared photodetector due to the Schottky barrier effect between its wide bandgap zone and the metal and the generation-recombination effect in the long-range transport of photo-induced carriers generated in the space charge region. While the photoconductive low-dimensional infrared detector has a particularly high dark current due to the characteristics of the narrow bandgap. In addition, the photoconductive device is slow in separation rate of photo-induced carriers due to the lack of the space charge region, and its response speed has long restricted its application scenario due to the significant photoconductive effect.

SUMMARY

To this end, the present disclosure provides an infrared photodetector based on a van der waals heterostructure and a preparation method thereof so as to accelerate the separation of photo-induced carriers while reducing the dark current of a device.

To achieve the objective, the present disclosure provides the following technical solutions:

An infrared photodetector based on a van der waals heterostructure is provided, which comprises: a fully depleted van der waals heterostructure.

The fully depleted van der waals heterostructure comprises a first n-type two-dimensional semiconductor layer, a p-type two-dimensional semiconductor layer, and a second n-type two-dimensional semiconductor layer which are sequentially provided from bottom to top.

The edge of at least one side of the first n-type two-dimensional semiconductor layer is in contact with the edge of at least one side of the second n-type two-dimensional semiconductor layer, at least one side of the p-type two-dimensional semiconductor layer extends out of a gap between the first n-type two-dimensional semiconductor layer and the second n-type two-dimensional semiconductor layer to form an extension part.

Alternatively, the first n-type two-dimensional semiconductor layer and the second n-type two-dimensional semiconductor layer are both made of n-type molybdenum disulfide; and the p-type two-dimensional semiconductor layer is made of p-type black phosphorus.

The thickness of the first n-type two-dimensional semiconductor layer is 10+/−2 nm, the thickness of the second n-type two-dimensional semiconductor layer is 20+/−5 nm, and the thickness of the p-type two-dimensional semiconductor layer is 80+/−5 nm.

Alternatively, the infrared photodetector further comprises a bottom electrode, a top electrode, a first self-aligned electrode and a second self-aligned electrode.

The bottom electrode is arranged at the lower part of the first n-type two-dimensional semiconductor layer, and the first self-alignment electrode is arranged at the upper part of the second n-type two-dimensional semiconductor layer.

The top electrode is arranged at the upper part of the extension part of the p-type two-dimensional semiconductor layer.

The second self-aligned electrode is arranged the top electrode and/or the upper part of the extension part.

Alternatively, work functions of the first self-aligned electrode and the second self-aligned function are used as a first work function.

Work functions of the first n-type two-dimensional semiconductor layer and the second n-type two-dimensional semiconductor layer are used as a second work function.

The first work function and the second work function have the similarity greater than a preset threshold.

Alternatively, the bottom electrode and the top electrode each comprise a Cr layer and a first Au layer which are sequentially provided from bottom to top, the thickness of the Cr layer is 5 to 15 nm, and the thickness of the first Au layer is 30 to 50 nm.

The first self-alignment electrode and the second self-alignment electrode each comprises a Bi layer and a second Au layer which are sequentially provided from bottom to top, the thickness of the Bi layer is 8+/−1 nm, and the thickness of the second Au layer is 2+/−1 nm.

Alternatively, the first self-alignment electrode and the second self-alignment electrode are formed by employing a self-alignment process.

Alternatively, the infrared photodetector further comprises a substrate layer and an insulation layer.

The insulation layer is arranged at the upper part of the substrate layer, and the bottom electrode is arranged at the upper part of the insulation layer.

A preparation method of an infrared photodetector based on a van der waals heterostructure, which comprises the following steps:
preparing a first n-type two-dimensional semiconductor layer and a second n-type two-dimensional semiconductor layer by using a mechanical exfoliation method, and transferring the first n-type two-dimensional semiconductor layer and the second n-type two-dimensional semiconductor layer to a glass slide covered with a polypropylene carbonate film;
preparing a p-type two-dimensional semiconductor layer by using a mechanical exfoliation method, and transferring the p-type two-dimensional semiconductor layer to the glass slide covered with the polypropylene carbonate film; and
sequentially transferring, by the polypropylene carbonate film, the first n-type two-dimensional semiconductor layer, the p-type two-dimensional semiconductor layer and the second n-type two-dimensional semiconductor layer to the bottom electrode of the infrared photodetector, enabling the edge of at least one side of the first n-type two-dimensional semiconductor layer to be in contact with the edge of at least one side of the second n-type two-dimensional semiconductor layer, and enabling at least one side of the p-type two-dimensional semiconductor layer to extend out of a gap between the first n-type two-dimensional semiconductor layer and the second n-type two-dimensional semiconductor layer to form an extension part.

Alternatively, the preparation method further comprises:
preparing a top electrode on the extension part; and
preparing self-aligned electrodes on the second n-type two-dimensional semiconductor layer, the extension part and the top electrode by using a self-alignment process, forming a first self-aligned electrode on the second n-type two-dimensional semiconductor layer, and forming a second self-aligned electrode on the extension part and/or the top electrode.

The present disclosure further provides a fully depleted van der waals heterostructure.

In accordance with specific embodiments of the present disclosure, the present disclosure discloses the following technical effects:

The present disclosure discloses an infrared photodetector based on a van der waals heterostructure and a preparation method thereof. The infrared photodetector comprises: a fully depleted van der waals heterostructure; the fully depleted van der waals heterostructure comprises a first n-type two-dimensional semiconductor layer, a p-type two-dimensional semiconductor layer, and a second n-type two-dimensional semiconductor layer which are sequentially provided from bottom to top. A fully depleted built-in electric field is formed by means of a sandwich structure including the first n-type two-dimensional semiconductor layer, the p-type two-dimensional semiconductor layer and the second n-type two-dimensional semiconductor layer, which may accelerate the separation of photo-induced carriers while reducing the dark current of the device.

Moreover, the light absorption efficiency of the device may be effectively enhanced by means of the standing wave effect generated by a microcavity formed by the bottom electrode and the first self-aligned electrode.

A metal (metal, including the bottom electrode, the top electrode, the first self-aligned electrode and the second self-aligned electrode) and semiconductor (semiconductor, including the first n-type two-dimensional semiconductor layer, the p-type two-dimensional semiconductor layer and the second n-type two-dimensional semiconductor layer) contact mode is provided. In combination with the advantages of the work function of Bi—$MoS_2$ (where the work function of Bi and the work function of $MoS_2$ are similar, and the potential barrier generated by the contact of the Bi and the $MoS_2$ may be completely eliminated if the work function of Bi and the work function of $MoS_2$ are identical), the transport barrier of the photo-induced carriers is remarkably reduced, and the collection efficiency of the photo-induced carriers may be effectively improved.

A transverse transport mode of the carriers in the detector may be eliminated by means of a self-alignment process, and the device may acquire an ultrafast response speed through the longitudinal transport of the carriers in the fully depleted built-in electric field of dozens of nanometers. Moreover, a fully wrapped structure may greatly improve the stability of the device.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 1 is a structural schematic diagram of an infrared photodetector based on a van der waals heterostructure in accordance with an embodiment of the present disclosure;

FIGS. 2A1, 2A2, 2B, 2C, and 2D are schematic diagrams illustrating an enhancement and depletion mechanism of an infrared photodetector in accordance with an embodiment of the present disclosure, where in FIG. 2, (A1) is a schematic diagram of the optical signal action principle of an infrared photodetector, (A2) is a schematic diagram of the electric signal action principle of an infrared photodetector; (B) is a schematic diagram illustrating normalized relative spectral response under blackbody radiation and normalized absorption of an n-p-n device with/without a metal mirror, (C) is a distribution diagram of vertical potentials of a device at the bias voltage of zero, and (D) is a distribution diagram of a built-in electric field in a vertical direction;

In the drawings:

Figure 2B:
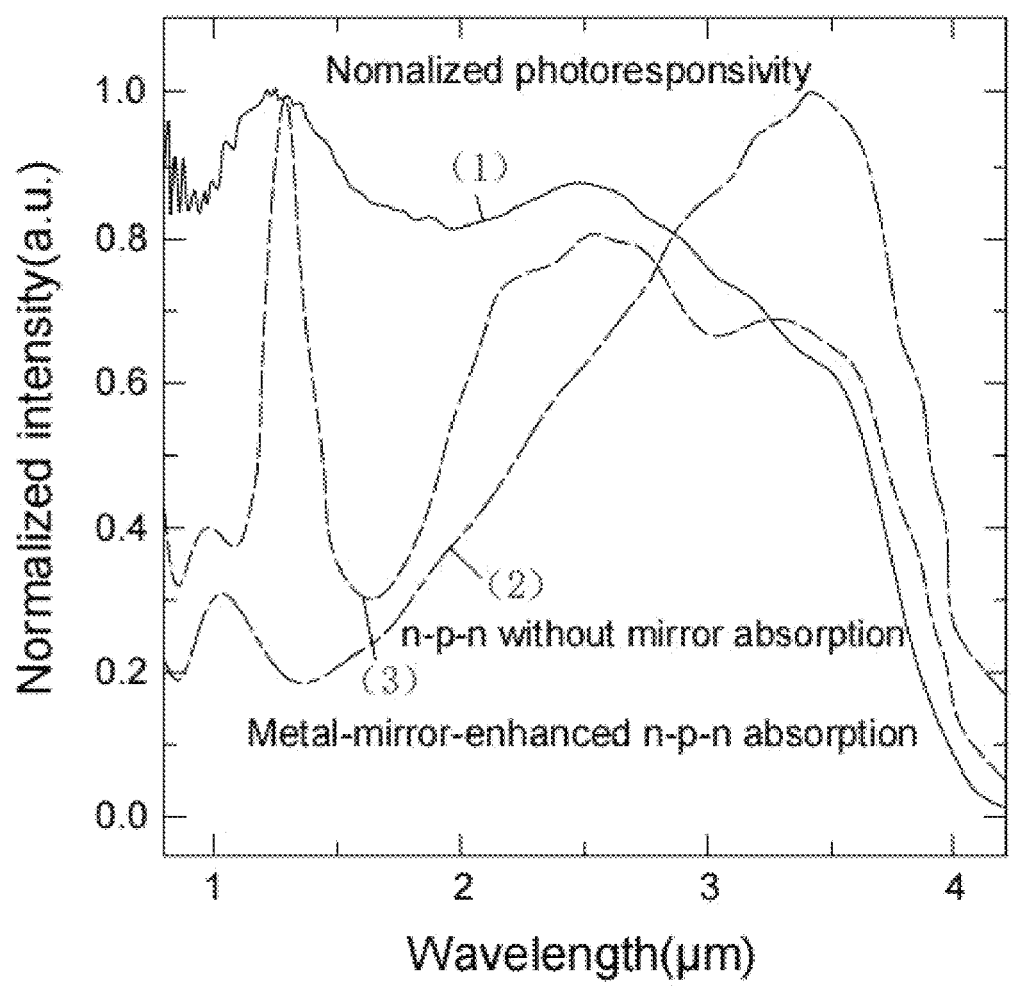

1—substrate layer; 2—insulation layer; 3—bottom electrode; 4-1—first n-type two-dimensional semiconductor layer; 4-2—second n-type two-dimensional semiconductor layer; 5—p-type two-dimensional semiconductor layer; 6—top electrode; 7-1—first self-aligned electrode; 7-2—second self-aligned electrode.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

An objective of the present disclosure is to provide an infrared photodetector based on a van der waals heterostructure and a preparation method thereof so as to improve the light absorption efficiency while reducing the dark current of a device, and the separation rate and collection efficiency of photo-induced carriers are accelerated.

To make the objectives, features and advantages of the present disclosure more apparently and understandably, the following further describes the present disclosure in detail with reference to the accompanying drawings and the specific embodiments.

Embodiment 1

As shown in FIG. 1, the embodiment 1 of the present disclosure provides an infrared photodetector based on a van der waals heterostructure. The infrared photodetector comprises a fully depleted van der waals heterostructure. The fully depleted van der waals heterostructure comprises a first n-type two-dimensional semiconductor layer 4-1, a p-type two-dimensional semiconductor layer 5, and a second n-type two-dimensional semiconductor layer 4-2 which are sequentially provided from bottom to top. The edge of at least one side of the first n-type two-dimensional semiconductor layer 4-1 is in contact with the edge of at least one side of the second n-type two-dimensional semiconductor layer 4-2, at least one side of the p-type two-dimensional semiconductor layer 5 extends out of a gap between the first n-type two-dimensional semiconductor layer 4-1 and the second n-type two-dimensional semiconductor layer 4-2 to form an extension part.

As a specific embodiment, as shown in FIG. 1, the structure of the infrared photodetector specifically comprises: a substrate layer 1, an insulation layer 2 is arranged on the substrate layer 1, and a layer of bottom electrode 3 is evaporated on the insulation layer 2. The first n-type two-dimensional semiconductor layer 4-1, the p-type two-dimensional semiconductor layer 5 and the second n-type two-dimensional semiconductor layer 4-2 are sequentially transferred onto the bottom electrode 3 to form a sandwich structure. A layer of top electrode 6 is evaporated on an unwrapped region (the extension part) of the p-type two-dimensional semiconductor layer 5, and a first self-aligned electrode 7-1 and a second self-aligned electrode 7-2 are at the uppermost layer.

The substrate layer 1 is an Si substrate.

The insulation layer 2 is made of $SiO_2$, and the thickness of the insulation layer is 280+/−10 nm.

The bottom electrode 3 is a Cr/Au electrode, and the thicknesses of the Cr and the Au are 5 to 15 nm and 30 to 50 nm, respectively.

The first n-type two-dimensional semiconductor layer 4-1 and the second n-type two-dimensional semiconductor layer 4-2 are both n-type molybdenum disulfide. The thickness of the first n-type two-dimensional semiconductor layer 4-1 is about 10+/−2 nm, and the thickness of the second n-type two-dimensional semiconductor layer 4-2 is about 20+/−5 nm.

The p-type two-dimensional semiconductor layer 5 is p-type black phosphorus, and the thickness of the p-type two-dimensional semiconductor layer is 80+/−5 nm.

The top electrode 6 is a Cr/Au electrode, and the thicknesses of the Cr and the Au are 5 to 15 nm and 30 to 50 nm, respectively.

The first self-aligned electrode 7-1 and the second self-aligned electrode 7-2 are both Bi/Au electrodes, and the thicknesses of the Bi and the Au are 8+/−1 nm and 2+/−1 nm, respectively.

Figure 2C:
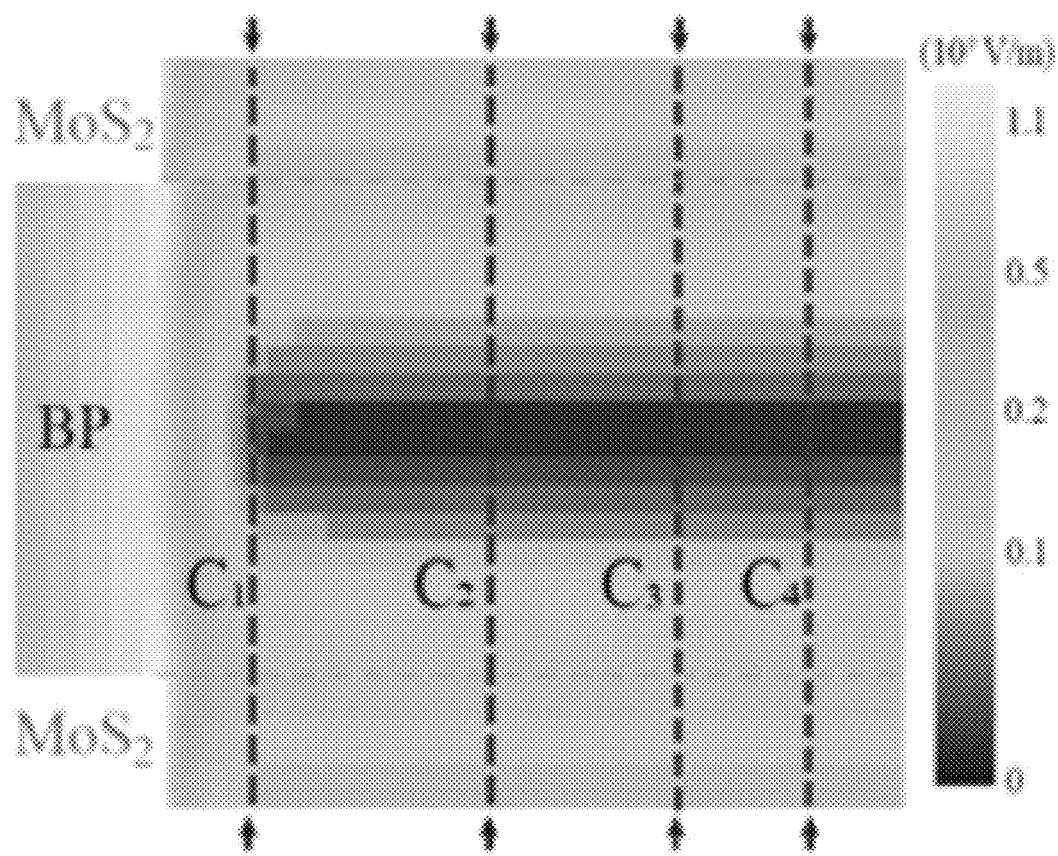
Figure 2D:
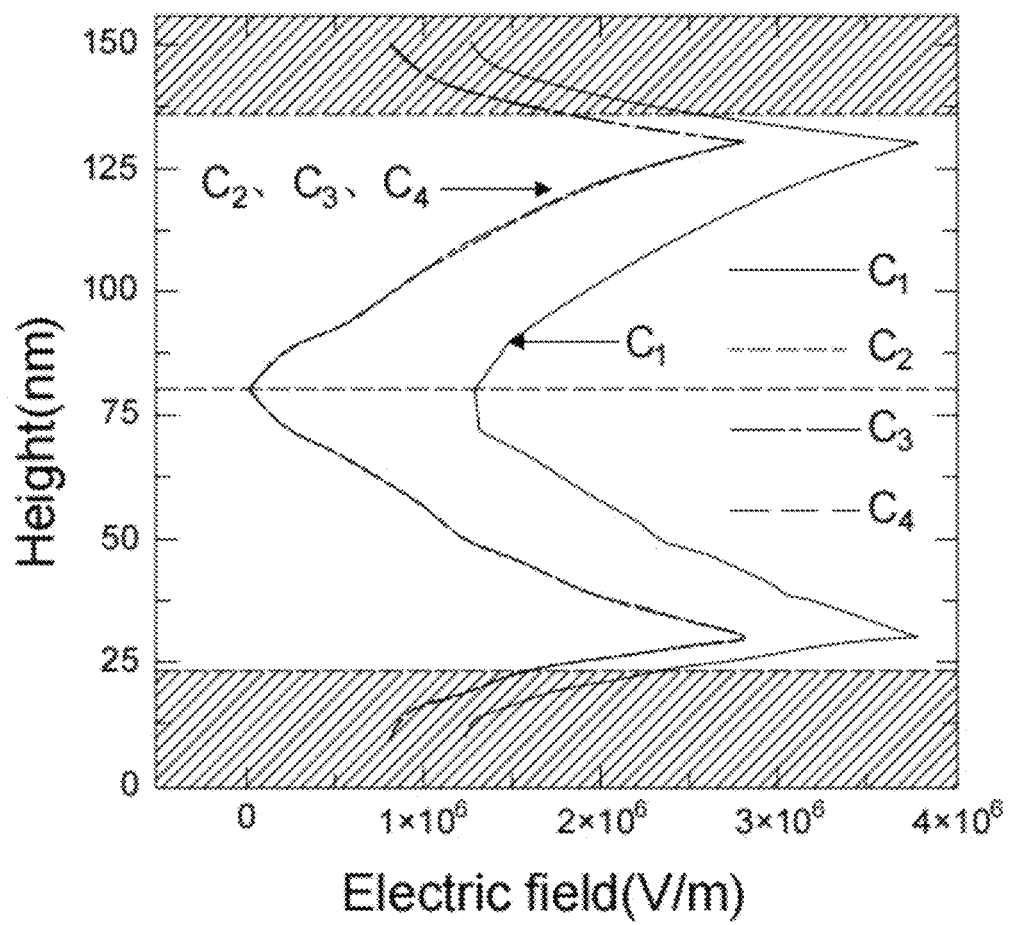

FIGS. 2A1, 2A2, 2B, 2C, and 2D are schematic diagrams illustrating an enhancement and depletion mechanism of an infrared photodetector in accordance with an embodiment of the present disclosure. FIG. 2A1 is a schematic diagram of the optical signal action principle of an infrared photodetector, FIG. 2A2 is a schematic diagram of the electric signal action principle of an infrared photodetector; curves marked as (1), (2) and (3) in FIG. 2B are a normalized relative spectral response intensity curve under the blackbody radiation, a normalized absorption intensity curve of an n-p-n device with a metal mirror, and a normalized absorption intensity curve of an n-p-n device without a metal reflector, where the abscissa represents Wavelength, and the ordinate represents Normalized intensity; FIG. 2C is a distribution diagram of vertical potentials of a device at the bias voltage of zero; FIG. 2C is a distribution diagram of a built-in electric field in a vertical direction, where the abscissa represents Electric field, and the ordinate represents Height.

As shown in FIGS. 2A1, 2A2, 2B, 2C, and 2D, the operating principle of the infrared photodetector is as follows: when the light is incident on the device, light absorption is significantly enhanced after the light is reflected multiple times within a cavity (a microcavity formed by the bottom electrode and the first self-aligned electrode). In the fully depleted van der waals heterostructure, electrons are transferred to a conduction band of $MoS_2$ (molybdenum disulfide), while holes are transferred to a valence band of BP (black phosphorus). For the photovoltaic response, photo-induced carriers are rapidly migrated to the $MoS_2$ in two opposite directions at the top and the bottom under action of a longitudinal built-in electric field of the sandwich structure n-p-n device, and then are efficiently collected by the fully wrapped metal electrodes. Photo-induced holes are migrated to the BP, and effectively collected by the self-aligned electrodes on the BP.

Figure 3A:
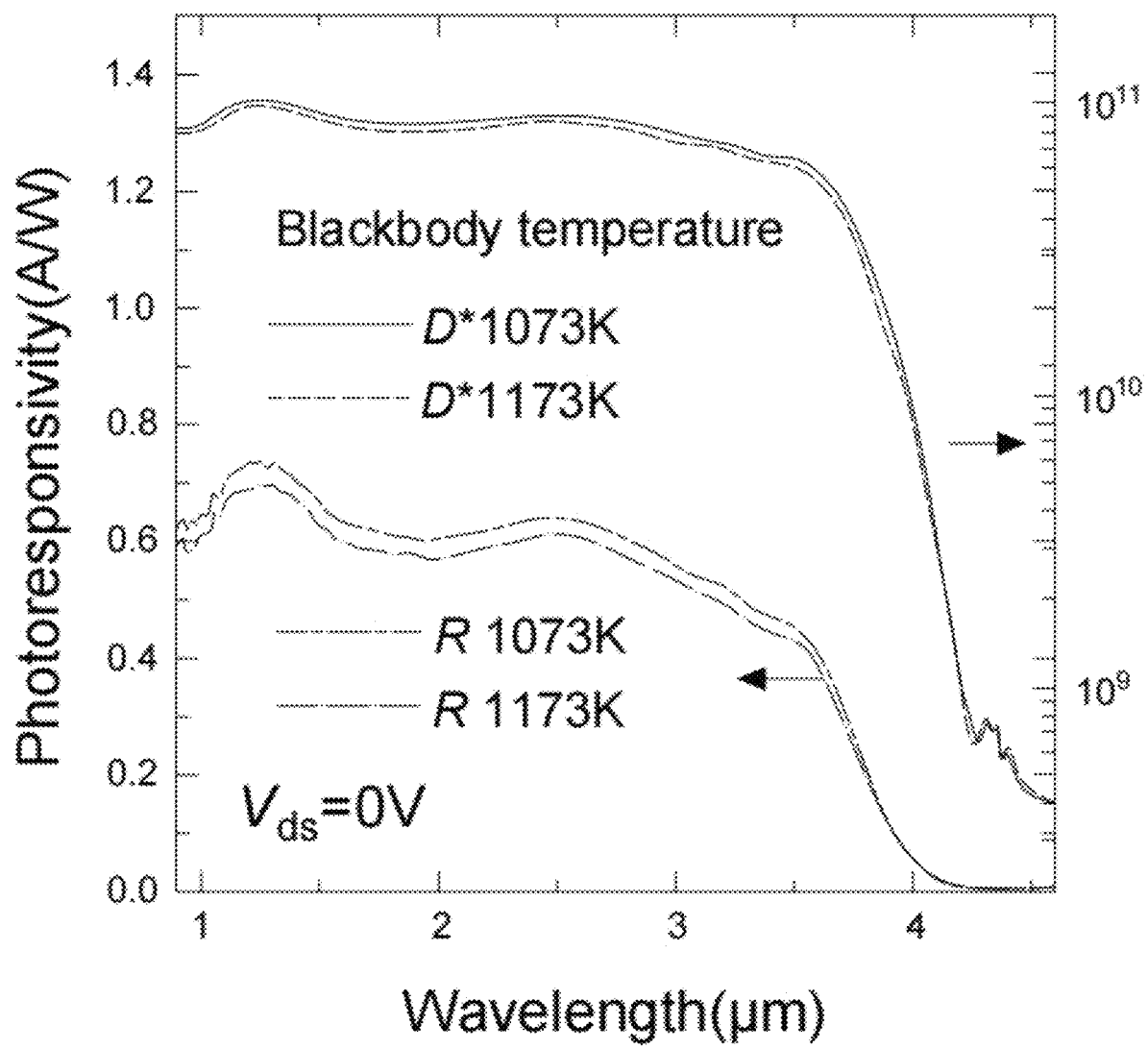
FIGS. 3A, 3B, and 3C are performance simulation diagrams of an infrared photodetector in accordance with the present disclosure, where in FIG. 3, (A) is a change plot of broadband spectral photovoltaic responsivity (the left axis) and specific detectivity D* (the right axis) with the wavelength under the blackbody irradiation of 1073 K and 1173 K, (B) is a schematic diagram of the rise time and the fall time of a device under the laser irradiation of 1550 nm when the bias voltage is 0 V, and (C) is a schematic diagram of the change of normalized photoresponse with modulation frequency under the laser irradiation of 1550 nm when the bias voltage is 0 V.
Figure 3B:
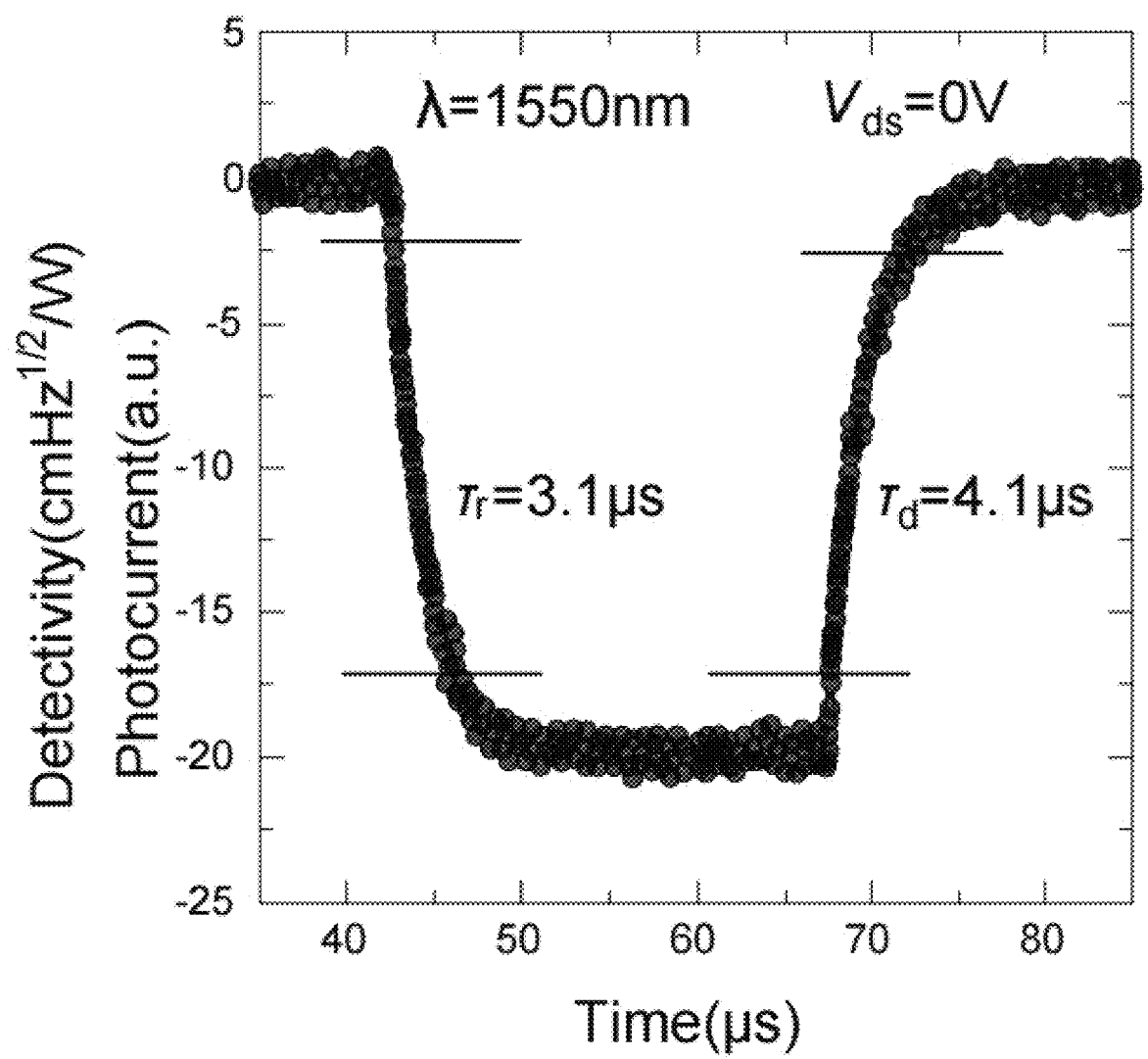
Figure 3C:
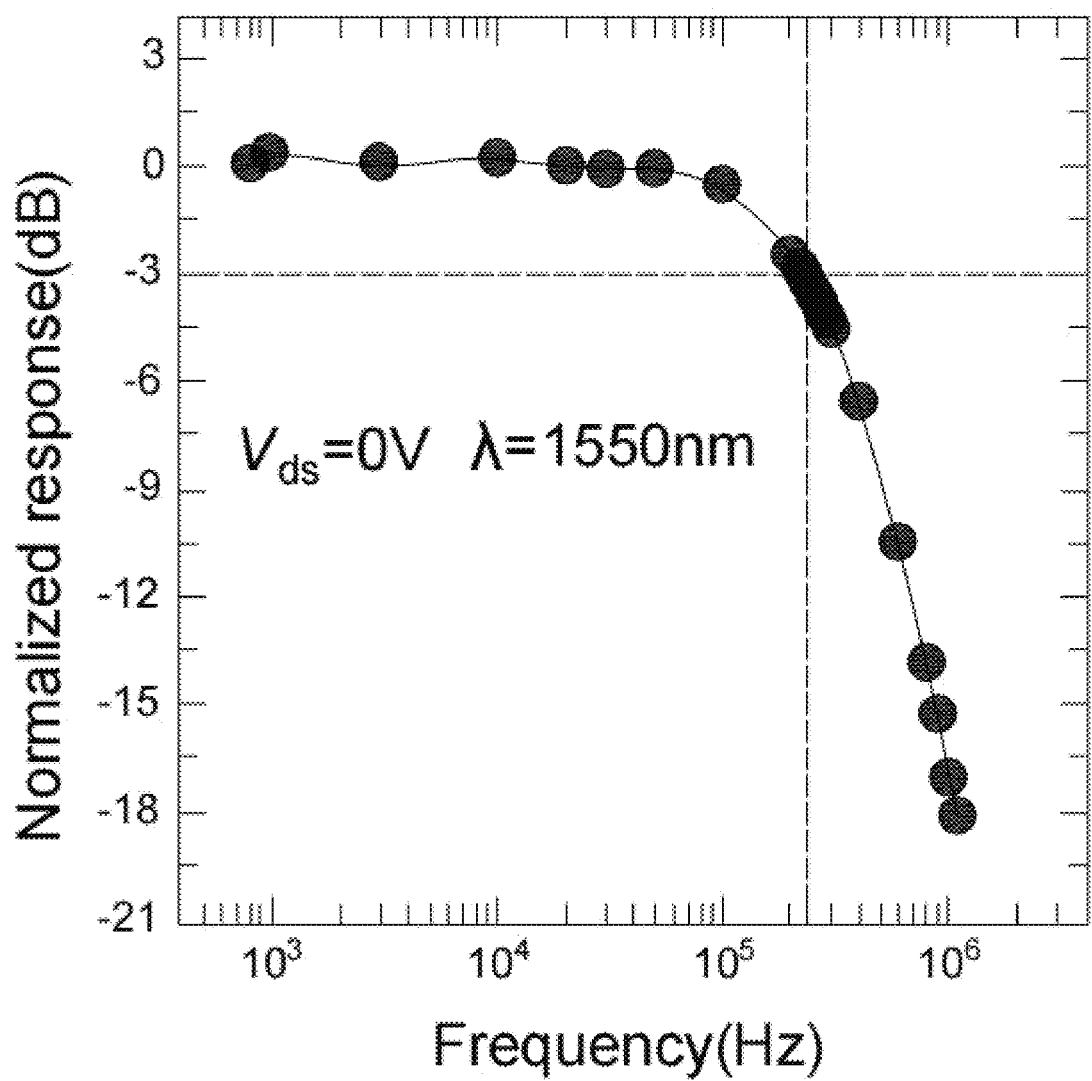

FIGS. 3A, 3B, and 3C are performance simulation diagrams of an infrared photodetector in accordance with the present disclosure. In FIG. 3, FIG. 3A is a change plot of broadband spectral Photovoltaic Responsivity (Photoresresponsivity on a left axis) and Specific Detectivity D* (Detectivity on a right axis) with the wavelength under the blackbody irradiation of 1073 K and 1173 K, where the abscissa represents Wavelength; FIG. 3B is a schematic diagram of a rise time and a fall time of a device under the laser irradiation of 1550 nm when the bias voltage is 0 V, where the abscissa represents time, and the ordinate represents Photocurrent; and FIG. 3C is a schematic diagram of the change of normalized photoresponse with modulation frequency under the laser irradiation of 1550 nm when the bias voltage is 0 V, where the abscissa represents Frequency, and the ordinate represents Normalized response.

It may be known from FIGS. 3B, 3C, and 3D that the quantum efficiency of the device may be enhanced by forming a light absorption microcavity between the bottom electrode and the first self-aligned electrode, the ultra-short vertical transport distance of dozens of nanometers for the photo-induced carriers may generate the ultrafast photoelectric response, and meanwhile, the fully depleted built-in electric field may effectively suppress the dark current of the device.

Embodiment 2

The embodiment 2 of the present disclosure provides a preparation method of an infrared photodetector based on a van der waals heterostructure. The preparation method comprises the following steps:
preparing a first n-type two-dimensional semiconductor layer and a second n-type two-dimensional semiconductor layer by using a mechanical exfoliation method, and transferring the first n-type two-dimensional semiconductor layer and the second n-type two-dimensional semiconductor layer to a glass slide covered with a polypropylene carbonate film;
preparing a p-type two-dimensional semiconductor layer by using a mechanical exfoliation method, and transferring the p-type two-dimensional semiconductor layer to the glass slide covered with the polypropylene carbonate film; and
sequentially transferring, by the polypropylene carbonate film, the first n-type two-dimensional semiconductor layer, the p-type two-dimensional semiconductor layer and the second n-type two-dimensional semiconductor layer to the bottom electrode of the infrared photodetector, enabling the edge of at least one side of the first n-type two-dimensional semiconductor layer to be in contact with the edge of at least one side of the second n-type two-dimensional semiconductor layer, and enabling at least one side of the p-type two-dimensional semiconductor layer to extend out of a gap between the first n-type two-dimensional semiconductor layer and the second n-type two-dimensional semiconductor layer to form an extension part.

As a specific embodiment, the preparation method comprises the following steps:
1) Preparation of a Bottom Electrode A bottom electrode 3 is prepared on an Si/SiO$_2$ substrate (including a substrate layer 1 and an insulation layer 2) by using an electron beam lithography technology, thermal evaporation and lift-off processes, where the thickness of the Cr is 5 to 15 nm, and the thickness of the Au is 30 to 50 nm.
2) Preparation and Transfer of n-Type Molybdenum Disulfide Sheets (a First n-Type Two-Dimensional Semiconductor Layer 4-1 and a Second n-Type Two-Dimensional Semiconductor Layer 4-2)

In a nitrogen-protected glove box, molybdenum disulfide sheets are prepared by using an adhesive tape and adopting a mechanical exfoliation method, and then are transferred onto a glass slide covered with a polypropylene carbonate film.
3) Preparation and Transfer of a Black Phosphorus Sheet (a p-Type Two-Dimensional Semiconductor Layer 5)

In a nitrogen-protected glove box, a black phosphorus sheet is prepared by using an adhesive tape and adopting a mechanical exfoliation method, and then is transferred onto a glass slide covered with a polypropylene carbonate film.
4) Preparation of a Fully Depleted Van Der Waals Heterostructure In a nitrogen-protected glove box, by means of a microscope-assisted fixed-point transfer platform, the molybdenum disulfide, the black phosphorus and the molybdenum disulfide are sequentially and nondestructively transferred onto the bottom electrode by using the polypropylene carbonate film, thereby forming a npn two-dimensional van der waals heterostructure with a sandwich structure (i.e., the fully depleted van der waals heterostructure).
5) Preparation of a Top Electrode A top electrode 6 is prepared on a p-type black phosphorous region (extension part) unwrapped by the MoS$_2$ by using an electron beam lithography technology, thermal evaporation and lift-off processes, where the thickness of the Cr is 5 to 15 nm, and the thickness of the Au is 30 to 50 nm.
6) Preparation of Self-Aligned Electrodes In combination with a self-alignment process, self-aligned electrodes are prepared on the molybdenum disulfide at the top, the black phosphorus and the top electrode at the upper end of the black phosphorus by utilizing an electron beam lithography (EBL) technology, thermal evaporation and lift-off processes. A first self-aligned electrode 7-1 is formed on the molybdenum disulfide at the top, a second self-aligned electrode is formed on the black phosphorus or the top electrode at the upper end of the black phosphorus, where the thickness of the Bi is 8+/−1 nm, and the thickness of the Au is 2+/−1 nm. After the device is prepared, a layer of PMMA (polymethyl methacrylate) photoresist is spin-coated as a protective layer.

Embodiment 3

A fully depleted van der waals heterostructure in the embodiment 1 is provided.

The standing wave effect of a light absorption microcavity formed between the bottom electrode and the first self-alignment electrode may enhance the quantum efficiency of the device. Moreover, a transport barrier of the photo-induced carriers is remarkably reduced by the sandwich fully wrapped metal-semiconductor contact mode and the Bi—MoS$_2$ work function advantages, and the collection efficiency of the photo-induced carriers may be effectively improved by combining a longitudinal short-distance transport mode of the carriers. In addition, the formed sandwich structure facilitates the formation of a fully depleted built-in electric field in the device, which may accelerate the separation of the photo-induced carriers while reducing the dark current of the device. Moreover, a transverse transport mode of the carriers in the detector may be eliminated through the self-alignment process of the device, and the device may acquire an ultrafast response speed through the longitudinal transport in the fully depleted built-in electric field of dozens of nanometers. The detector disclosed by the present disclosure has the features of high quantum efficiency, high signal-to-noise ratio, ultra-fast response and the like.

Various embodiments are described herein in a progressive manner, and each embodiment is focused on the difference from other embodiments, and same and similar parts of the various embodiments are referred to with respect to each other.

Several examples are used for illustration of the principles and implementation methods of the present disclosure. The description of the embodiments is merely used to help illustrate the method and its core principles of the present disclosure. In addition, a person of ordinary skill in the art can make various modifications in terms of specific embodiments and scope of application in accordance with the teachings of the present disclosure. In conclusion, the content of this specification shall not be construed as a limitation to the present disclosure.

What is claimed is:

1. An infrared photodetector based on a van der waals heterostructure, wherein the infrared photodetector comprises: a fully depleted van der waals heterostructure
the fully depleted van der waals heterostructure comprises a first n-type two-dimensional semiconductor layer, a p-type two-dimensional semiconductor layer, and a second n-type two-dimensional semiconductor layer which are sequentially provided from bottom to top;
the edge of at least one side of the first n-type two-dimensional semiconductor layer is in contact with the edge of at least one side of the second n-type two-dimensional semiconductor layer, at least one side of the p-type two-dimensional semiconductor layer extends out of a gap between the first n-type two-dimensional semiconductor layer and the second n-type two-dimensional semiconductor layer to form an extension part.

2. The infrared photodetector based on the van der waals heterostructure according to claim 1, wherein the first n-type two-dimensional semiconductor layer and the second n-type two-dimensional semiconductor layer are both made of n-type molybdenum disulfide; and the p-type two-dimensional semiconductor layer is made of p-type black phosphorus;
the thickness of the first n-type two-dimensional semiconductor layer is 10+/−2 nm, the thickness of the second n-type two-dimensional semiconductor layer is 20+/−5 nm, and the thickness of the p-type two-dimensional semiconductor layer is 80+/−5 nm.

3. The infrared photodetector based on the van der waals heterostructure according to claim 1, wherein the infrared photodetector further comprises: a bottom electrode, a top electrode, a first self-aligned electrode, and a second self-aligned electrode;
the bottom electrode is arranged at the lower part of the first n-type two-dimensional semiconductor layer, and the first self-alignment electrode is arranged at the upper part of the second n-type two-dimensional semiconductor layer;
the top electrode is arranged at the upper part of the extension part of the p-type two-dimensional semiconductor layer;
the second self-aligned electrode is arranged the top electrode and/or the upper part of the extension part.

4. The infrared photodetector based on the van der waals heterostructure according to claim 3, wherein work functions of the first self-aligned electrode and the second self-aligned function are used as a first work function;
work functions of the first n-type two-dimensional semiconductor layer and the second n-type two-dimensional semiconductor layer are used as a second work function;
the first work function and the second work function have the similarity greater than a preset threshold.

5. The infrared photodetector based on the van der waals heterostructure according to claim 3, wherein the bottom electrode and the top electrode each comprise a Cr layer and a first Au layer which are sequentially provided from bottom to top, the thickness of the Cr layer is 5 to 15 nm, and the thickness of the first Au layer is 30 to 50 nm;
the first self-alignment electrode and the second self-alignment electrode each comprises a Bi layer and a second Au layer which are sequentially provided from bottom to top, the thickness of the Bi layer is 8+/−1 nm, and the thickness of the second Au layer is 2+/−1 nm.

6. The infrared photodetector based on the van der waals heterostructure according to claim 3, wherein the first self-alignment electrode and the second self-alignment electrode are formed by employing a self-alignment process.

7. The infrared photodetector based on the van der waals heterostructure according to claim 3, wherein the infrared photodetector further comprises a substrate layer and an insulation layer;
the insulation layer is arranged at the upper part of the substrate layer, and the bottom electrode is arranged at the upper part of the insulation layer.

8. A preparation method of an infrared photodetector based on a van der waals heterostructure, wherein the preparation method comprises the following steps:
preparing a first n-type two-dimensional semiconductor layer and a second n-type two-dimensional semiconductor layer by using a mechanical exfoliation method, and transferring the first n-type two-dimensional semiconductor layer and the second n-type two-dimensional semiconductor layer to a glass slide covered with a polypropylene carbonate film;
preparing a p-type two-dimensional semiconductor layer by using a mechanical exfoliation method, and transferring the p-type two-dimensional semiconductor layer to the glass slide covered with the polypropylene carbonate film; and
sequentially transferring, by the polypropylene carbonate film, the first n-type two-dimensional semiconductor layer, the p-type two-dimensional semiconductor layer and the second n-type two-dimensional semiconductor layer to the bottom electrode of the infrared photodetector, enabling the edge of at least one side of the first n-type two-dimensional semiconductor layer to be in contact with the edge of at least one side of the second n-type two-dimensional semiconductor layer, and enabling at least one side of the p-type two-dimensional semiconductor layer to extend out of a gap between the first n-type two-dimensional semiconductor layer and the second n-type two-dimensional semiconductor layer to form an extension part.

9. The preparation method of the infrared photodetector based on the van der waals heterostructure according to claim 8, wherein the preparation method further comprises:
preparing a top electrode on the extension part; and
preparing self-aligned electrodes on the second n-type two-dimensional semiconductor layer, the extension part and the top electrode by using a self-alignment process, forming a first self-aligned electrode on the second n-type two-dimensional semiconductor layer, and forming a second self-aligned electrode on the extension part and/or the top electrode.

10. A fully depleted van der waals heterostructure in the infrared photodetector according to claim 1.

11. The fully depleted van der waals heterostructure in the infrared photodetector according to claim 10, wherein the first n-type two-dimensional semiconductor layer and the second n-type two-dimensional semiconductor layer are both made of n-type molybdenum disulfide; and the p-type two-dimensional semiconductor layer is made of p-type black phosphorus;

the thickness of the first n-type two-dimensional semiconductor layer is 10+/−2 nm, the thickness of the second n-type two-dimensional semiconductor layer is 20+/−5 nm, and the thickness of the p-type two-dimensional semiconductor layer is 80+/−5 nm.

12. The fully depleted van der waals heterostructure in the infrared photodetector according to claim 10, wherein the infrared photodetector further comprises: a bottom electrode, a top electrode, a first self-aligned electrode, and a second self-aligned electrode;

the bottom electrode is arranged at the lower part of the first n-type two-dimensional semiconductor layer, and the first self-alignment electrode is arranged at the upper part of the second n-type two-dimensional semiconductor layer;

the top electrode is arranged at the upper part of the extension part of the p-type two-dimensional semiconductor layer;

the second self-aligned electrode is arranged the top electrode and/or the upper part of the extension part.

13. The fully depleted van der waals heterostructure in the infrared photodetector according to claim 12, wherein work functions of the first self-aligned electrode and the second self-aligned function are used as a first work function; work functions of the first n-type two-dimensional semiconductor layer and the second n-type two-dimensional semiconductor layer are used as a second work function;

the first work function and the second work function have the similarity greater than a preset threshold.

14. The fully depleted van der waals heterostructure in the infrared photodetector according to claim 12, wherein the bottom electrode and the top electrode each comprise a Cr layer and a first Au layer which are sequentially provided from bottom to top, the thickness of the Cr layer is to 15 nm, and the thickness of the first Au layer is 30 to 50 nm;

the first self-alignment electrode and the second self-alignment electrode each comprises a Bi layer and a second Au layer which are sequentially provided from bottom to top, the thickness of the Bi layer is 8+/−1 nm, and the thickness of the second Au layer is 2+/−1 nm.

15. The fully depleted van der waals heterostructure in the infrared photodetector according to claim 12, wherein the first self-alignment electrode and the second self-alignment electrode are formed by employing a self-alignment process.

16. The fully depleted van der waals heterostructure in the infrared photodetector according to claim 12, wherein the infrared photodetector further comprises a substrate layer and an insulation layer;

the insulation layer is arranged at the upper part of the substrate layer, and the bottom electrode is arranged at the upper part of the insulation layer.

* * * * *